(12) United States Patent
Naeemi et al.

(10) Patent No.: US 11,043,592 B2
(45) Date of Patent: Jun. 22, 2021

(54) ANTIFERROMAGNET FIELD-EFFECT BASED LOGIC CIRCUITS INCLUDING SPIN ORBITAL COUPLING CHANNELS WITH OPPOSING PREFERRED CURRENT PATHS AND RELATED STRUCTURES

(71) Applicant: Georgia Tech Research Corporation, Atlanta, GA (US)

(72) Inventors: Azad Naeemi, Atlanta, GA (US); Chenyun Pan, Arlington, TX (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 16/541,564

(22) Filed: Aug. 15, 2019

(65) Prior Publication Data
US 2020/0058795 A1 Feb. 20, 2020

Related U.S. Application Data

(60) Provisional application No. 62/719,208, filed on Aug. 17, 2018.

(51) Int. Cl.
*H01L 29/78* (2006.01)
*H01L 43/02* (2006.01)
*H01F 10/32* (2006.01)
*H03K 19/16* (2006.01)

(52) U.S. Cl.
CPC ..... *H01L 29/78391* (2014.09); *H01F 10/329* (2013.01); *H01F 10/3268* (2013.01); *H01L 43/02* (2013.01); *H03K 19/16* (2013.01)

(58) Field of Classification Search
CPC ........... H01L 29/78391; H01F 10/3268; H01F 10/329
See application file for complete search history.

(56) References Cited

U.S. PATENT DOCUMENTS

2017/0069831 A1* 3/2017 Nikonov ................. H01L 43/08
2018/0240896 A1 8/2018 Nikonov et al.

OTHER PUBLICATIONS

Nishtha, et al., *Energy Efficient Electronic Systems (E3S)*. 2015 Fourth Berkeley Symposium on. IEEE, 2015.

* cited by examiner

*Primary Examiner* — Marc Anthony Armand
(74) *Attorney, Agent, or Firm* — Stanek Lemon Crouse & Meeks, P.A.

(57) ABSTRACT

An anti-ferromagnetic (AFM) voltage-controlled field effect logic device structure can include an AFM material that extends in a first direction and an input voltage terminal that extends opposite the AFM material. An oxide material can be located between the AFM material and the input voltage terminal. A first spin orbital coupling (SOC) material can extend in a second direction across the AFM material to provide a first SOC channel with a drain voltage terminal at a first end of the first SOC channel and an output voltage terminal at a second end of the first SOC channel that is opposite the first end. A contact can be electrically coupled to the output voltage terminal and configured to electrically couple to a second SOC material extending in the second direction spaced apart from the first SOC material to provide a second SOC channel.

20 Claims, 6 Drawing Sheets

INVERTER

FIG. 7

NAND2

ANTIFERROMAGNET FIELD-EFFECT BASED LOGIC CIRCUITS INCLUDING SPIN ORBITAL COUPLING CHANNELS WITH OPPOSING PREFERRED CURRENT PATHS AND RELATED STRUCTURES

CLAIM FOR PRIORITY

The present Application claims priority to U.S. Provisional Application Ser. No. 62/719,208 entitled Energy-Efficient Antiferromagnet Field-Effect Transistor Logic Implementation, filed in the U.S.P.T.O on Aug. 17, 2018, the entire disclosure of which is hereby incorporated herein by reference.

STATEMENT OF FEDERAL SUPPORT

This invention was made with United States Government support, Grant No. 70NANB17H041, awarded by the National Institute of Standards and Technology (NIST), an agency of the United States Department of Commerce, and Grant No. 1740136, awarded by the National Science Foundation (NSF). The Government has certain rights in the invention.

FIELD

The present invention relates to the field of electronics in general, and more particularly, to anti-ferromagnetic devices.

BACKGROUND

There is a global search for devices that can complement or even replace CMOS technology, and sustain the exponential growth of chip throughput. Magnetic devices, which provide new features such as non-volatility and low-voltage operation, have been analyzed as a type of device that may be suitable. However, most magnetic devices are based on magnetization switching in ferromagnets, which can have delays on the order of nanoseconds. Compared to conventional charge-based FETs, this large switching delay may lead to increased power and energy dissipation.

Voltage-controlled antiferromagnet field-effect transistor (AFMFET) devices may be competitive with CMOS FETs as those devices can provide competitive switching speeds and low energy dissipation per binary switching operation. An AFMFET device is discussed in US20180240896A1 filed in the U.S.P.T.O. on Feb. 17, 2018, entitled "Magneto-electric logic devices using semiconductor channel with large spin-orbit coupling". Another AFMFET device approach is presented in Sharma, Nishtha, et. al., "Magneto-electric magnetic tunnel junction logic devices." *Energy Efficient Electronic Systems (E3S), 2015 Fourth Berkeley Symposium on*. IEEE, 2015.

SUMMARY

Embodiments according to the present invention can provide antiferromagnet field-effect based logic circuits including spin orbital coupling channels with opposing preferred current paths and related structures. Pursuant to these embodiments, an anti-ferromagnetic (AFM) voltage-controlled field effect logic device structure can include an AFM material that extends in a first direction and an input voltage terminal that extends opposite the AFM material. An oxide material can be located between the AFM material and the input voltage terminal. A first spin orbital coupling (SOC) material can extend in a second direction across the AFM material to provide a first SOC channel with a drain voltage terminal at a first end of the first SOC channel and an output voltage terminal at a second end of the first SOC channel that is opposite the first end. A contact can be electrically coupled to the output voltage terminal and configured to electrically couple to a second SOC material extending in the second direction spaced apart from the first SOC material to provide a second SOC channel.

In some embodiments, an anti-ferromagnetic (AFM) field effect transistor device can include an AFM material that extends in a first direction that generates a boundary magnetization in response to a field effect and first and second spin orbital coupling channels can be on the AFM material, where the first and second spin orbital coupling channels are configured to form a low-resistance current path in the first channel and a high-resistance current path in the second channel, respectively, responsive to a spin orbital coupling effect generated by the boundary magnetization.

In some embodiments, An anti-ferromagnetic (AFM) voltage-controlled field effect logic device can include an AFM material extending in a direction and configured to provide a boundary magnetization thereof to generate a spin orbital coupling effect in separate spin orbital coupling materials to provide low-resistance current paths in opposite directions through the separate spin orbital coupling materials relative to the direction in which the AFM material extends.

DETAILED DESCRIPTION OF EMBODIMENTS ACCORDING TO THE INVENTION

Exemplary embodiments of the present disclosure are described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

As described herein in some embodiments according to the present invention, spin orbital coupling channels, located opposite an AFM material, can be coupled in-series with one another to provide a pull-up/pull-down network that can function as a logical device, such as a logical inverter device, in response to an input voltage. In particular, the spin orbital coupling channels can be coupled together so that a path from Vdd to GND within the pull-up/pull-down network crosses over the AFM twice. This type of arrangement allows the AFM to create a preferred path for current flow (i.e., which way current flows more easily) in each of spin orbital coupling channels that is different in response to a single input voltage. For example, in some operations, when the input voltage is high, one of the spin orbital coupling channels provides a preferred path for current flow in a first direction whereas the other spin orbital coupling channel provides a preferred path for current flow in a second direction. Because the spin orbital coupling channels are coupled together in a pull-up/pull-down network, the first spin orbital coupling channel can operate to provide the pull-up to Vdd in response to a low input voltage, whereas the second spin orbital coupling channel can operate to provide the pull-down to GND in response to high low input voltage.

Accordingly, an AFM voltage-controlled field effect logic device structure can include the AFM material, a spin orbital coupling material (to provide an SOC channel) and a contact that is configured to electrically couple to another spin orbital coupling material (providing a second SOC channel) can provide a basic building block to create AFM voltage-controlled field effect logic devices. In some embodiments, this AFM voltage-controlled field effect logic device structure can be used to construct logical devices such as a logical inverter and a NAND logical gate. Other logical devices that are analogous to those provided as part of a CMOS logic device library may also be provided using AFM voltage-controlled field effect logic device structures according to embodiments of the invention.

Still further, the AFM voltage-controlled field effect logic device structure described herein can also be used to provide a majority-gate based logic device which operates responsive to the voltage levels of a majority of the inputs applied to respective voltage terminals opposite the AFM material.

Moreover, as appreciated by the present inventors, the approach described herein may not require dedicated MOS-FETs to drive subsequent logic stages or special clocking schemes. Embodiments according to the invention achieve many of the needs for general logic applications including nonlinearity, gain, concatenability, feedback prevention, and a complete set of Boolean operations. The proposed logic implementation can also have a compact layout that is comparable to the CMOS technology.

It will be understood that AFM voltage-controlled field effect logic device structures and devices are further described in Complementary Logic Implementation for Antiferromagnet Field-Effect Transistors by Prof. Chenyun Pan and Prof. Azad Naeemi, published on Oct. 30, 2018 in IEEE Journal on Exploratory Solid-State Computational Devices and Circuits (Volume: 4, Issue: 2, December 2018), the entire disclosure of which is incorporated herein by reference.

Figure 1A:
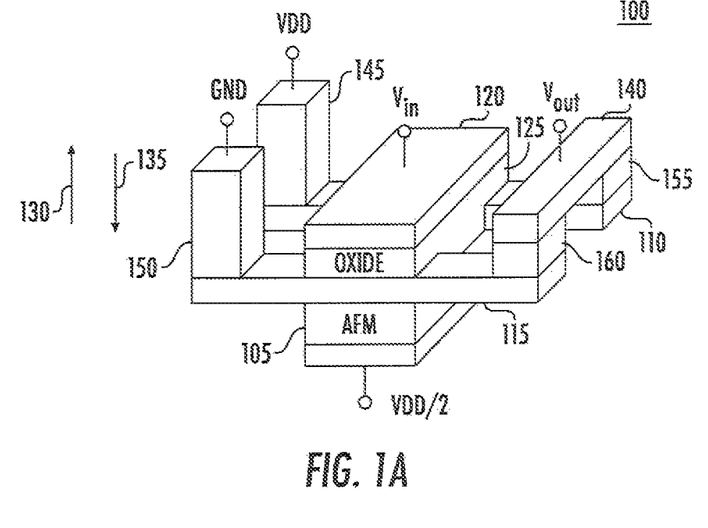
FIG. 1A is a perspective diagram of an Anti-FerroMagnetic (AFM) voltage-controlled field effect inverter logic device including an AFM material with first and second spin orbital coupling (SOC) channels crossing the AFM material to provide opposing preferred current paths in response to an input voltage applied to the AFM in some embodiments according to the invention.

FIG. 1A is a perspective diagram of an AFM voltage-controlled field effect inverter logic device 100 including an AFM material 105 that extends in a first direction with first and second spin orbital coupling (SOC) channels 110 and 115 crossing the AFM material 105 in a second direction to provide opposing preferred current paths in response to an input voltage applied to an input voltage terminal 120 voltage that is separated from the AFM material 105 by an oxide material 125 in some embodiments according to the invention.

According to FIG. 1A, the AFM material 105 can be a material selected to generate a boundary magnetization in response to a field effect created by the input voltage that is applied to the input voltage terminal 120. It will be understood that the boundary magnetization can be generated in at least two different directions responsive to respective voltage levels applied to the input voltage terminal 120. For example, in some embodiments, the boundary magnetization can be directed in an upward direction 130 in response to a first voltage level and can be directed in a downward direction 135 in response to a second voltage level.

The first and second SOC channels 110 and 115 can be formed of respective SOC materials that cross over the AFM material 105, and which are selected to provide a spin orbital coupling effect that is generated by the different boundary magnetizations described above. For example, when the boundary magnetization is downward, the first and second SOC channels 110 and 115 can operate with a spin orbital coupling effect that provides a preferred current flow in a first direction across the AFM material 105. In contrast, when the boundary magnetization is upward, the first and second SOC channels 110 and 115 can operate with a spin orbital coupling effect that provides a preferred current flow in a second direction across the AFM material 105 that is opposite the first direction.

It will be understood that the term "preferred current flow" can mean that current can flow more readily in the first direction rather than the second direction. In some embodiments, when an the SOC channel is described as having a preferred current flow in a particular direction, the SOC channel material provides a relatively low-resistance current path in that direction whereas the SOC channel material provides a relatively high-resistance current path in the opposite direction. Other characterizations of the preferred current flow may also be used. It will also be understood that the possible orientations of the AFM materials relative to the SOC channel materials is not limited to the relative orientations shown in the figures. For example, in some embodiments, the AFM material and the SOC channel materials cross one another at an oblique angle. In still further embodiments, the AFM material and the SOC channel materials may not necessarily be orthogonal to one another in the upward/downward directions.

It will be understood that the AFM material 105, SOC material, and other materials used for the formation of AFM voltage-controlled field effect devices may be those discussed in P. A. Dowben et al., "Towards a strong spin-orbit coupling magnetoelectric transistor," IEEE J. Explor. Solid-State Comput. Devices Circuits, vol. 4, no. 1, pp. 1-9, June 2018, the entirety of which is hereby incorporated herein by reference.

Still referring to FIG. 1A, one end of the first SOC channel 110 is coupled to drain voltage supply Vdd for the first end of the AFM voltage-controlled field effect inverter logic device 100 by, for example, an interconnect 145. The other end of the SOC channel 110 extends across the AFM material to an interconnect 155 that provides an output voltage terminal for the AFM voltage-controlled field effect inverter logic device 100.

Further, one end of the second SOC channel 115 is coupled to a GND supply GND (or other reference voltage level relative to the drain voltage supply Vdd) via an interconnect 150 and extends across the AFM material 105 where the other end of the second SOC channel 115 is coupled to an interconnect 160. The ends of the first and second SOC channels 110 and 115 at the output voltage terminal are electrically coupled together by a contact 140. It will be understood that the contact 140 can be a material that provides an ohmic connection between the ends of the first and second SOC channels 110 and 115. In some embodiments, the contact 140 includes a metal. In some embodiments, the contact 140 includes a doped semiconductor. In some embodiments, the contact 140 has a resistivity of about 10−3 ohm-m to about 10−9 ohm-m.

Figure 1B:
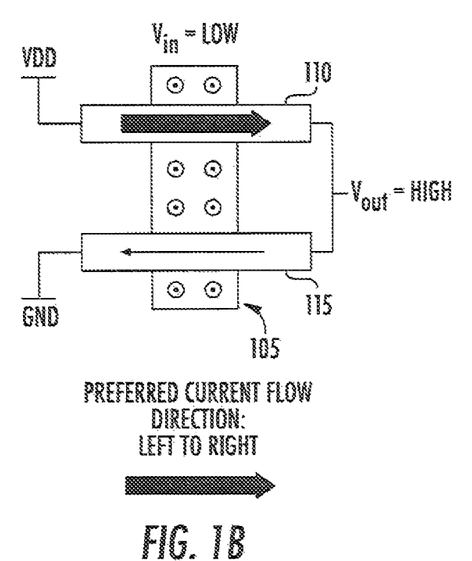
FIGS. 1B and 1C are plan views of the AFM voltage-controlled field effect inverter logic device of FIG. 1A showing the opposing preferred current paths in the first and second SOC channels in response to a low input voltage and in response to a high input voltage applied to the AFM, respectively, in some embodiments according to the invention.
Figure 1C:
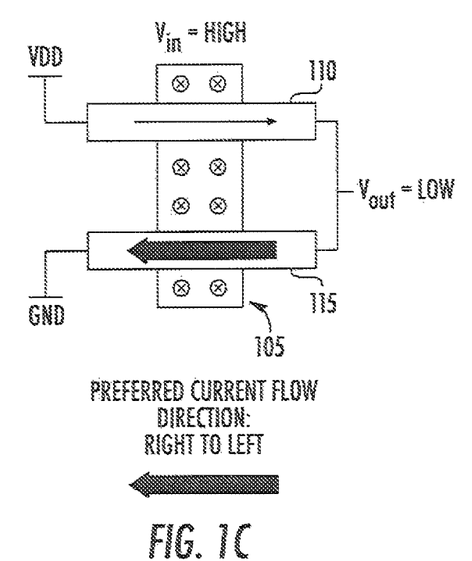

FIGS. 1B and 1C are plan views of the AFM voltage-controlled field effect inverter logic device 100 of FIG. 1A showing the opposing preferred current paths in the first and second SOC channels in response to a low input voltage and in response to a high input voltage applied to the AFM, respectively, in some embodiments according to the invention. According to FIGS. 1B and 1C, when the input voltage is low (FIG. 1B) the AFM voltage-controlled field effect inverter logic device 100 operates to generate a high voltage output by providing the preferred current path from Vdd toward the output voltage terminal so as to "pull up" the output voltage to about Vdd. Moreover, the low input voltage also provides a high-resistance current path in the second SOC channel 115 from the output voltage terminal toward GND so that the voltage at the output voltage terminal remains "pulled-up" by Vdd.

Figure 10:
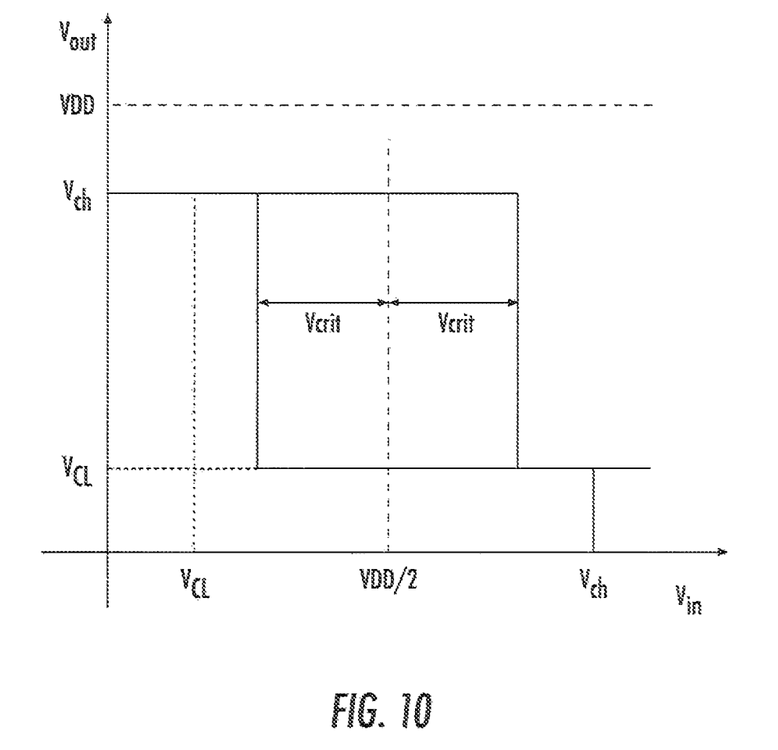
FIG. 10 illustrates a voltage transfer characteristic of the AFM voltage-controlled field effect inverter logic device in FIGS. 1A-C in some embodiments.

In particular, the direction of the currents flowing through the SOC channels 110 and 115 of FIGS. 1B and 1C in the pull-up and pull-down networks are left-to-right and right-to-left, respectively. Depending on the input voltage, the boundary magnetization of the AFM material 105 switches, leading to an asymmetry of the current flow in the two SOC channels 105 110. For instance, when the input voltage is low as shown in FIG. 1B the preferred current direction is from left-to-right. Therefore, the output voltage is pulled close to VDD, achieving the inversion operation. The voltage transfer characteristic (VTC) of the inverter logic device 100 is illustrated in FIG. 10, where V_CL and V_CH correspond to the minimum and maximum output voltages. The device is considered active and has a large gain when the input voltage is above or below half of the supply voltage by the threshold voltage of the AFM, $V_{crit}$.

Figure 2A:
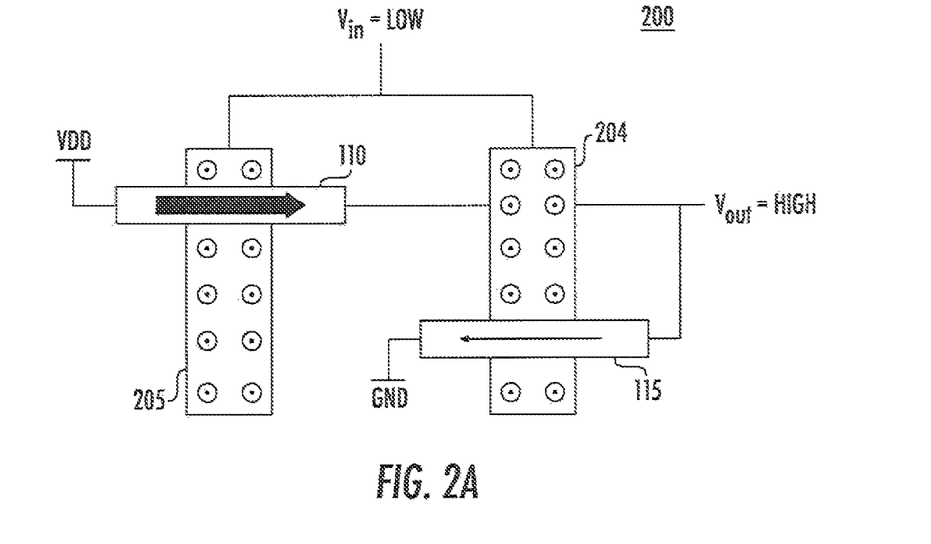
FIGS. 2A and 2B are plan views of an AFM voltage-controlled field effect inverter logic device including first and second AFM materials and showing opposing preferred current paths in first and second SOC channels in response to a low input voltage applied to the first and second AFM materials and in response to a high input voltage applied to the first and second AFM materials, respectively, in some embodiments according to the invention.
Figure 2B:
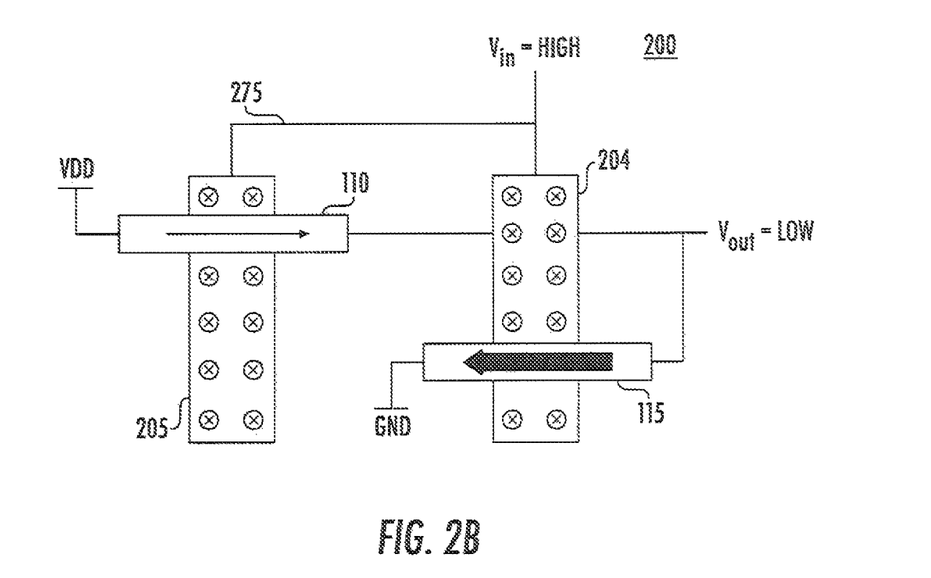

FIGS. 2A and 2B are plan views of an AFM voltage-controlled field effect inverter logic device 200 including first and second AFM materials 205 and 206 and showing opposing preferred current paths in first and second SOC channels 110 and 115 in response to a low input voltage applied to both the first and second AFM materials in FIG. 2A and in response to a high input voltage applied to both the first and second AFM materials in FIG. 2B, respectively, in some embodiments according to the invention. According to FIGS. 2A and 2B, the operations carried out by the AFM voltage-controlled field effect inverter logic device 200 are the same as those described above in reference to FIGS. 1A-C. In the embodiments illustrated by FIGS. 2A and 2B, however, separate first and second AFM materials 205 and 206 are used rather than the single AFM material 105 in FIGS. 1A-1C. Further in FIGS. 2A and 2B, the first and second SOC channels 110 and 115 are located on the first and second AFM materials 205 and 206, respectively, and are connected into the same type of pull-up/pull-down network shown in FIG. 1A-C. As shown, however, the first and second AFM materials 205 and 206 are coupled to the same input voltage terminal 275.

Figure 3:
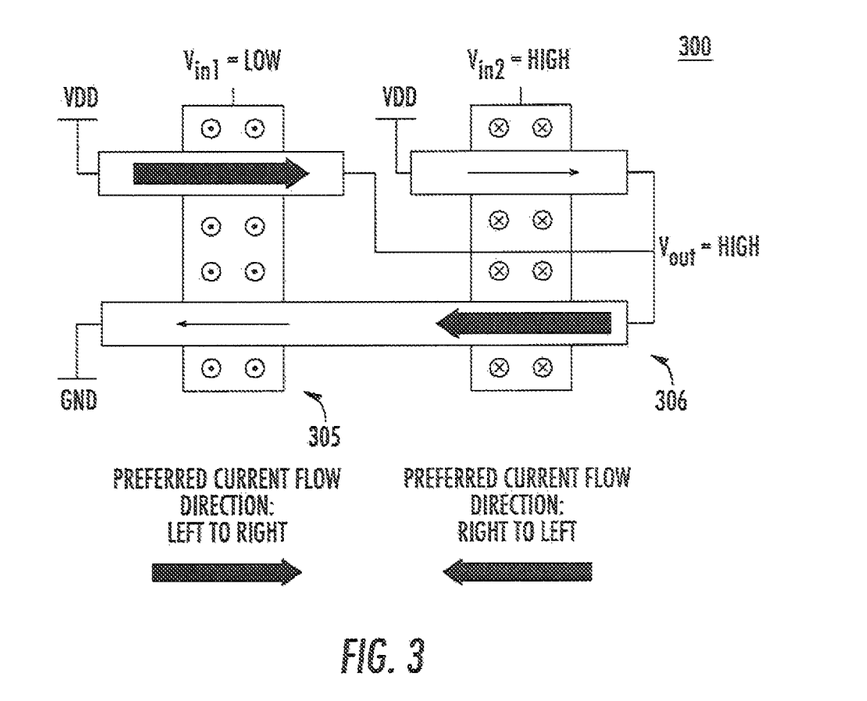
FIG. 3 is a plan view of an AFM voltage-controlled field effect NAND logic device including first and second AFM materials and showing preferred current paths in first and second SOC channels in response to a low input voltage and a high input voltage applied to the respective AFM materials in some embodiments according to the invention.

FIG. 3 is a plan view of an AFM voltage-controlled field effect NAND logic device 300 including first and second AFM materials 305 and 306 and showing preferred current paths in first, second and third SOC channels in response to a low input voltage and a high input voltage applied to the two AFM materials 305 and 306, respectively, in some embodiments according to the invention. According to FIG. 3, When multiple current paths are connected in series/parallel, the overall current is dominated by the least/most conductive path. As appreciated by the present inventors, this is analogous to the operation of CMOS logic, with the difference being that p- and n-channel devices are replaced with devices with left-to-right and right-to-left current paths, respectively. By connecting AFMFET devices in the pull-up and pull-down networks properly, all complementary logic functions can be achieved. The voltage generated at the output is static, which can directly drive the input of the next stage without using auxiliary field-effect transistors or any special clocking schemes.

Figure 4:
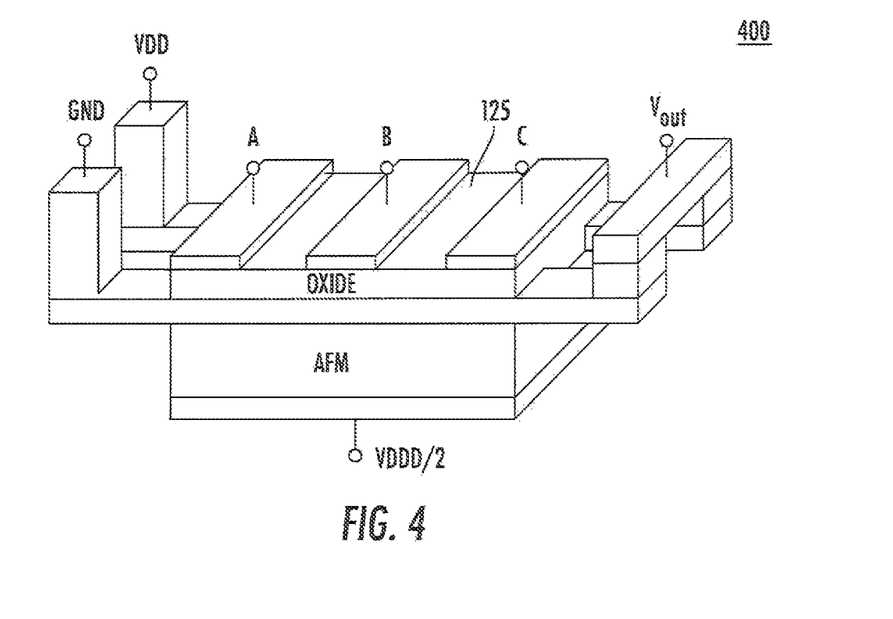
FIG. 4 is a perspective diagram of an AFM voltage-controlled field effect majority logic device including an AFM material with first and second SOC channels crossing the AFM material to provide opposing preferred current paths in response to three separate input voltages applied to the AFM material in some embodiments according to the invention.

FIG. 4 is a perspective diagram of an AFM voltage-controlled field effect majority logic device 400 including an AFM material 405 with first and second SOC channels 105 and 110 crossing the AFM material 405 to provide opposing preferred current paths in response to three separate input voltages applied to the AFM material 405 in some embodiments according to the invention. It will be understood that the AFM material 405 can be any AFM material that provides a large domain size relative to the AFM materials that may be used to provide the other logical devices described herein. In some embodiments, the AFM material 405 can have a domain size that is at least about 3 times greater than that of the AFM materials that may be used to provide some of the other logical devices described herein. In some embodiments, the AFM material 405 can have a domain size that is at least about 5 times greater than that of the AFM materials that may be used to provide some of the other logical devices described herein. In some embodiments, the AFM material 405 can have a domain size that is at least about 10 times greater that of the AFM materials that may be used to provide some of the other logical devices described herein. In some embodiments, the AFM material 405 may be $Cr_2O_3$.

According to FIG. 4, input voltage terminals A-C are segmented so as to be electrically isolated from one another and are arranged on the oxide material opposite the AFM material 105. The AFM voltage-controlled field effect majority logic device 400 operates responsive to the voltage levels applied at a majority of the input voltage terminals A-C opposite the AFM material 105. For example, if two or more of the voltages applied to input voltage terminals A-C are high, then the generated output is a low. If, however, two or more of the voltages applied to input voltage terminals A-C are low, then the generated output is a high.

Figure 5:
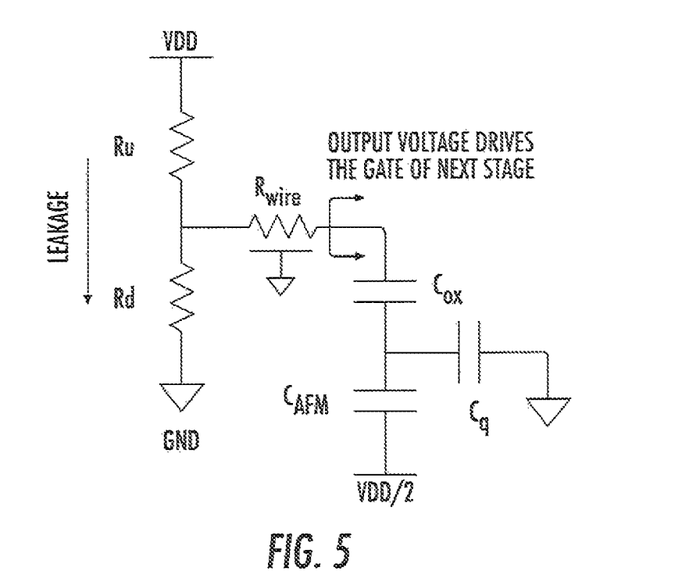
FIG. 5 is an equivalent circuit of the AFM voltage-controlled field effect structure as a pull-up/pull down network utilized to couple AFM voltage-controlled field effect structures together to provide the AFM voltage-controlled field effect based logic devices described herein where Ru and Rd are the pull-up and pull-down network resistances, respectively, and CAFM, Cox, and Cq are the AFM capacitance, oxide capacitance, and quantum capacitance in some embodiments according to the invention.
Figure 6:
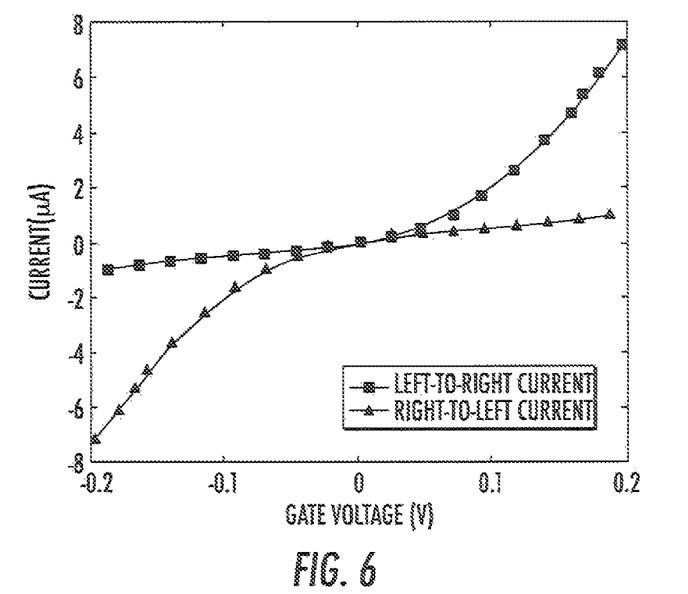
FIG. 6 is a graph illustrating the IV gate characteristics of the AFM voltage-controlled field effect structures herein in some embodiments according to the invention.

FIG. 5 is an equivalent circuit of the AFM voltage-controlled field effect structure as a pull-up/pull down network utilized to couple AFM voltage-controlled field effect structures together to provide the AFM voltage-controlled field effect based logic devices described herein where Ru and Rd are the pull-up and pull-down network resistances, respectively, and CAFM, Cox, and Cq are the AFM capacitance, oxide capacitance, and quantum capacitance in some embodiments according to the invention.

A device-level performance modeling approach was taken to estimate the intrinsic delay, energy, and footprint area of the proposed AFMFET logic in some embodiments. Instead of using spin-transfer-torque (STT) as the switching mechanism, the AFMFET device relies on voltage controlled magnetoelectric (exchange bias) effect. The intrinsic delay of an AFMFET logic gate is modeled as:

$$t_{int} = t_{AFM} + t_{RC}, \quad (1)$$

where $t_{AFM}$ is the intrinsic switching delay of AFM, which is assumed to be 10 ps, and $t_{RC}$ is the electrical RC delay based on the equivalent circuit model illustrated in, where $R_u$ and $R_d$ are the pull-up and pull-down network resistances, respectively, $C_{AFM}$, $C_{ox}$, and $C_q$ are the AFM capacitance, oxide capacitance, and quantum capacitance.

The dielectric constants for AFM and oxide are 12 and 3.9 respectively, and the thickness of AFM and oxide layers are 10 nm and 1 nm, respectively. The quantum capacitance is assumed to be 50% of the gate oxide capacitance. The values of the pull-up and pull-down resistances are determined by the SOC channel resistance, which depends on the direction of magnetoelectric polarization of the AFM. The relation between the current and gate voltage, shown in FIG. 7 which illustrates the IV gate characteristics of the AFM voltage-controlled field effect structures herein in some embodiments according to the invention. The IV gate characteristics are obtained by using Non-Equilibrium Green's Function (NEGF) transport simulations in a 2-D ribbon with a width of 20 nm and a band mass of 0.1 $m_e$. A value of exchange splitting of 0.1 eV at 300 K is assumed.

To model the energy dissipation of the AFMFET logic, the dynamic switching energy during charging and discharging the gate capacitance is written as:

$$E_{dyn} = \frac{1}{2} C_g \Delta V^2, \quad (2)$$

where $\Delta V$ is the voltage swing at the output. To drive the next stage without additional transistors, the minimum value of $\Delta V$ is determined by the switching voltage of the AFM, V_AFM, which is written as:

$$|\Delta V = V_{AFM}(\bar{C}_{AFM} + \bar{C}_{ox})/C_{ox}$$

Note that both the electric field, E, and a small symmetry breaking magnetic field, H, are needed simultaneously to perform isothermal switching of Chromia, where the product of E and H needs to overcome a critical threshold.

For the leakage energy calculation, if the ON-OFF ratio is small, a supply clocking scheme can be employed such that the device only consumes leakage power during the logic operation. The corresponding leakage energy is written as:

$$E_{leak} = \frac{VDD^2}{R_u + R_d + R_{clk}} t_{clk}, \quad (3)$$

where t_clk is half of the clock period, R_clk is the equivalent ON resistance of the clocking transistor per AFMFET logic gate, and VDD is the supply voltage. For a given V_AFM, the voltage swing at the output can be calculated, which determines the supply voltage according to the equation below:

$$VDD = \frac{2\Delta V(R_u + R_d + R_{clk})}{|R_u - R_d|}. \quad (4)$$

The clock speed is limited to 5 GHz, and the transistor resistance follows the 15 nm CMOS high-performance device used in the previous benchmarking work, assuming the width of the transistor is 150 nm.

The switching energy associated with the supply clocking is written as:

$$E_{clk} = \frac{1}{2}(C_{wire} + C_{clk})VDD^2, \quad (5)$$

where C_wire and C_clk are the interconnect capacitance and gate capacitance of the clocking transistors. Interconnect parasitic capacitance is 0.15 fF/μm, which is estimated based on a validated capacitance model, and the input capacitance of clocking transistors is 0.2 fF. The number of logic gates shared by a clocking transistor is set as 10 to achieve the proper balance between footprint area, dynamic and leakage energy overheads of the supply clocking.

The total intrinsic energy of an AFMFET logic gate is the summation of all energy components:

$$E_{int} = E_{dyn} + E_{leak} + E_{clk}, \quad (6)$$

Figure 7:
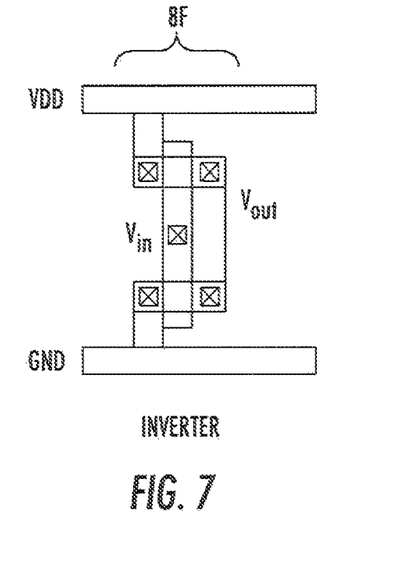
FIG. 7-9 are exemplary layouts of an AFM voltage-controlled field effect inverter logic device, an AFM voltage-controlled field effect NAND logic device, and an AFM voltage-controlled field effect majority logic device in some embodiments according to the invention.
Figure 8:
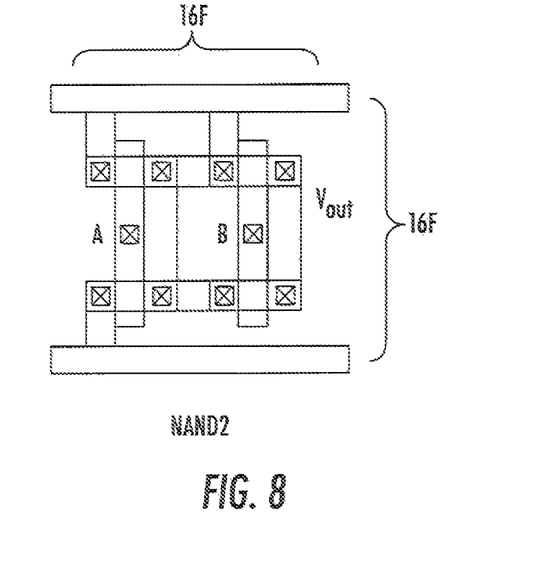
Figure 9:
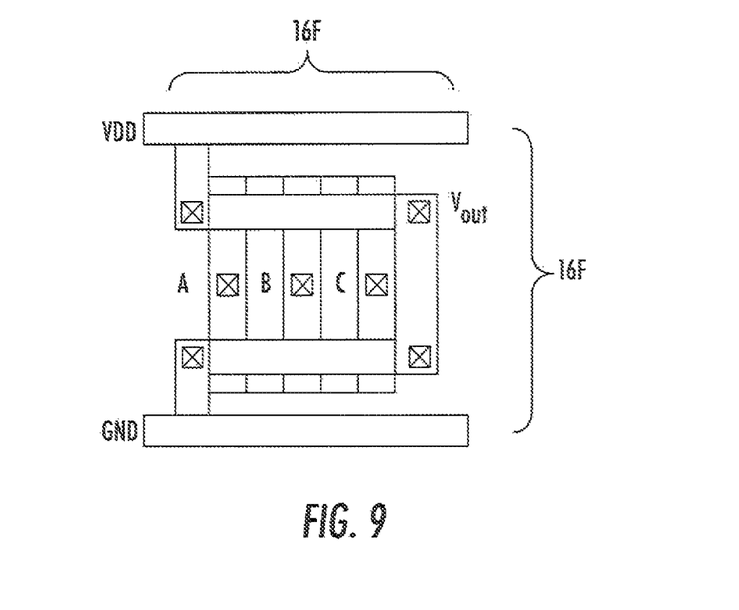

FIG. 7-9 are exemplary layouts of an AFM voltage-controlled field effect inverter logic device, an AFM voltage-controlled field effect NAND logic device, and an AFM voltage-controlled field effect majority logic device in some embodiments according to the invention.

The design rule follows the previous benchmarking methodology, where the minimum distance between two contacts is 4 F. The footprint area of the proposed AFMFET logic is comparable to its CMOS counterpart for a basic inverter. For a two-input NAND gate, 33% of the footprint area overhead is observed. For a majority gate, the AFMFET device provides a large area saving thanks to the compact design and layout.

As described herein in some embodiments according to the present invention, spin orbital coupling channels, located opposite an AFM material, can be coupled in-series with one another to provide a pull-up/pull-down network that can function as a logical device, such as a logical inverter device, in response to an input voltage. In particular, the spin orbital coupling channels can be coupled together so that a path from Vdd to GND within the pull-up/pull-down network crosses over the AFM twice. This type of arrangement allows the AFM to create a preferred path for current flow (i.e., which way current flows more easily) in each of spin orbital coupling channels that is different in response to a single input voltage. For example, in some operations, when the input voltage is high, one of the spin orbital coupling channels provides a preferred path for current flow in a first direction whereas the other spin orbital coupling channel provides a preferred path for current flow in a second direction. Because the spin orbital coupling channels are coupled together in a pull-up/pull-down network, the first spin orbital coupling channel can operate to provide the pull-up to Vdd in response to a low input voltage, whereas the second spin orbital coupling channel can operate to provide the pull-down to GND in response to high low input voltage.

The terminology used herein is for the purpose of describing particular embodiments only and is not intended to be limiting to other embodiments. As used herein, the singular forms "a", "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

As will be appreciated by one of skill in the art, various embodiments described herein may be embodied as a device, method of operating, and/or systems. Some embodiments may be described herein with reference to flowchart illustrations and/or block diagrams of methods, and systems according to embodiments.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall support claims to any such combination or subcombination.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the various embodiments described herein. As used herein, the term "and/or" includes any and all combinations of one or more of the associated listed items

What is claimed:

1. An anti-ferromagnetic (AFM) voltage-controlled field effect logic device structure comprising:
   an AFM material extending in a first direction;
   an input voltage terminal extending opposite the AFM material;
   an oxide material between the AFM material and the input voltage terminal;
   a first spin orbital coupling (SOC) material extending in a second direction across the AFM material to provide a first SOC channel with a drain voltage terminal at a first end of the first SOC channel and an output voltage terminal at a second end of the first SOC channel that is opposite the first end; and
   a contact electrically coupled to the output voltage terminal and configured to electrically couple to a second SOC material extending in the second direction spaced apart from the first SOC material to provide a second SOC channel.

2. The AFM voltage-controlled field effect logic device structure of claim 1 wherein the second SOC material extends across the AFM material in the second direction to provide a ground terminal of the AFM voltage-controlled field effect logic device structure at an opposite end of the second SOC channel.

3. The AFM voltage-controlled field effect logic device structure of claim 2 wherein the contact ohmically couples the output voltage terminal to a first end of the second SOC channel directly adjacent to the AFM material to provide an AFM based logical inverter device.

4. The AFM voltage-controlled field effect logic device structure of claim 3 wherein the contact has a resistivity of about $10^{-3}$ ohm-m to about $10^{-9}$ ohm-m.

5. The AFM voltage-controlled field effect logic device structure of claim 1 wherein the AFM material comprises a first AFM material, the input voltage terminal comprises a first input voltage terminal and the oxide material comprises a first oxide material, the AFM voltage-controlled field effect logic device structure further comprising:
   a second AFM material extending in the first direction spaced apart from the first AFM material, wherein the second SOC material extends across the second AFM material in the second direction;
   a second input voltage terminal opposite the second AFM material and separated from the first input voltage terminal; and
   a second oxide material on the second input voltage terminal between the second AFM material and the second input voltage terminal.

6. The AFM voltage-controlled field effect logic device structure of claim 5 wherein the second SOC material extends in the second direction across the first AFM material and across the second AFM material to provide the second SOC channel and a third SOC channel, respectively, the AFM voltage-controlled field effect logic device structure further comprising:
   a third SOC material extending perpendicular across the second AFM material to provide a fourth channel electrically coupled to the output voltage terminal; and
   the second input voltage terminal is opposite the third SOC material.

7. The AFM voltage-controlled field effect logic device structure of claim 6 wherein a first end of the third SOC channel is coupled to the drain voltage terminal and a second end of the third SOC channel.

8. The AFM voltage-controlled field effect logic device structure of claim 3 wherein the input voltage terminal is segmented to electrically isolate portions of the input voltage terminal into separate first, second, and third input voltage terminals on the oxide material opposite the AFM material.

9. An anti-ferromagnetic (AFM) field effect transistor device comprising:
an AFM material extending in a first direction that generates a boundary magnetization in response to a field effect; and
first and second spin orbital coupling channels on the AFM material, the first and second spin orbital coupling channels configured to form a low-resistance current path in the first channel and a high-resistance current path in the second channel, respectively, responsive to a spin orbital coupling effect generated by the boundary magnetization.

10. The AFM field effect transistor device of claim 9 wherein the spin orbital coupling effect comprises a first spin orbital coupling effect configured to generate the low-resistance current path in a first direction responsive to a low voltage level coupled to the AFM material and comprises a second spin orbital coupling effect configured to generate the low-resistance current path in a second direction responsive to a high voltage level coupled to the AFM material.

11. The AFM field effect transistor device of claim 9 wherein the first and second spin orbital coupling channels extend across the AFM material to beyond opposite sides of the AFM material and wherein adjacent ends of the first and second spin orbital coupling channels on the same side of the AFM material are coupled together.

12. The AFM field effect transistor device of claim 11 wherein the adjacent ends of the first and second spin orbital coupling channels on the same side of the AFM material are ohmically coupled together.

13. The AFM field effect transistor device of claim 12 wherein a contact coupling the adjacent ends of the first and second spin orbital coupling channels has a resistivity of about $10^{-3}$ ohm-m to about $10^{-9}$ ohm-m.

14. The AFM field effect transistor device of claim 9 wherein first and second spin orbital coupling channels define an oblique angle with an edge of the AFM material where the first and second spin orbital coupling channels intersect the AFM material.

15. An anti-ferromagnetic (AFM) voltage-controlled field effect logic device comprising:
an AFM material extending in a direction and configured to provide a boundary magnetization thereof to generate a spin orbital coupling effect in separate spin orbital coupling materials to provide low-resistance current paths in opposite directions through the separate spin orbital coupling materials; and
an ohmic material coupling the low-resistance current paths together.

16. The AFM voltage-controlled field effect logic device of claim 15 wherein the output node is coupled to an input of a next stage AFM voltage-controlled field effect logic device.

17. The AFM voltage-controlled field effect logic device of claim 15 wherein the AFM voltage-controlled field effect logic device comprises an inverter logic device configured to provide an output voltage at a node where the ohmic material couples the low-resistance current paths together that is a logical inverse of an input voltage provided to the AFM material.

18. The AFM voltage-controlled field effect logic device of claim 16 wherein the separate spin orbital coupling materials comprise a first channel and a second channel separated from one another and each extending across the AFM material in a second direction that is perpendicular to the first direction, the AFM voltage-controlled field effect logic device further comprising:
a drain voltage node on a first end of the first channel;
a source voltage node on a first end of the second channel; and
an output voltage node on a second end of the first channel and on a second end of the second channel at the output node.

19. An anti-ferromagnetic (AFM) voltage-controlled field effect logic device comprising:
an AFM material extending in a direction and configured to provide a boundary magnetization thereof to generate a spin orbital coupling effect in separate spin orbital coupling materials to provide low-resistance current paths in opposite directions through the separate spin orbital coupling materials; and
wherein an output voltage is generated based on voltage division at an output node of the AFM voltage-controlled field effect logic device.

20. The AFM voltage-controlled field effect logic device of claim 19 wherein the output node is coupled to an input of a next stage AFM voltage-controlled field effect logic device.

* * * * *

UNITED STATES PATENT AND TRADEMARK OFFICE
CERTIFICATE OF CORRECTION

PATENT NO. : 11,043,592 B2  
APPLICATION NO. : 16/541564  
DATED : June 22, 2021  
INVENTOR(S) : Naeemi et al.

Page 1 of 1

It is certified that error appears in the above-identified patent and that said Letters Patent is hereby corrected as shown below:

In the Specification

Column 7, Line 67:

Delete "$|\Delta V = V_{AFM}(\bar{C}_{AFM} + \bar{C}_{ox})/C_{ox}$"

Insert -- $\Delta V = V_{AFM}(C_{AFM} + C_{OX})/C_{OX}$ --

Signed and Sealed this  
Ninth Day of November, 2021

Drew Hirshfeld  
*Performing the Functions and Duties of the*  
*Under Secretary of Commerce for Intellectual Property and*  
*Director of the United States Patent and Trademark Office*